(12) United States Patent
Wu

(10) Patent No.: US 12,388,182 B2
(45) Date of Patent: Aug. 12, 2025

(54) ANTENNA AND ELECTRONIC DEVICE

(71) Applicant: GUANGDONG OPPO MOBILE TELECOMMUNICATIONS CORP., LTD., Guangdong (CN)

(72) Inventor: Xiaopu Wu, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 147 days.

(21) Appl. No.: 18/461,616

(22) Filed: Sep. 6, 2023

(65) Prior Publication Data

US 2023/0411847 A1    Dec. 21, 2023

Related U.S. Application Data

(63) Continuation of application No. PCT/CN2022/082912, filed on Mar. 25, 2022.

(30) Foreign Application Priority Data

Apr. 13, 2021 (CN) .......................... 202110396848.0

(51) Int. Cl.
  *H01Q 5/335*  (2015.01)
  *H01Q 5/357*  (2015.01)
  *H03H 7/38*   (2006.01)

(52) U.S. Cl.
  CPC ............. *H01Q 5/335* (2015.01); *H01Q 5/357* (2015.01); *H03H 7/38* (2013.01)

(58) Field of Classification Search
  CPC .......... H03H 7/38; H01Q 9/045; H01Q 5/378; H01Q 5/335; H01Q 1/50; H01Q 1/38;
  (Continued)

(56) References Cited

U.S. PATENT DOCUMENTS

| 2020/0006842 | A1  |   | 1/2020 | Zhu |
| 2021/0305962 | A1* | 9/2021 | Li  ........................ H01Q 1/2291 |
| 2023/0141980 | A1* | 5/2023 | Tsai ....................... H01Q 5/378 |
| | | | | 343/893 |

FOREIGN PATENT DOCUMENTS

| CN | 205509017   | 8/2016 |
| CN | 205509017 U * | 8/2016 |

(Continued)

OTHER PUBLICATIONS

Translation of CN 205509017 U (Year: 2016).*

(Continued)

*Primary Examiner* — Renan Luque
(74) *Attorney, Agent, or Firm* — Hodgson Russ LLP

(57) ABSTRACT

An antenna and an electronic device are provided. The antenna includes a first radiator, a matching circuit, a first adjustment circuit, a signal source, and a second radiator. The first adjustment circuit is electrically connected to the matching circuit. The signal source electrically connects the matching circuit to the feed point. A gap is defined between the second radiator and the first radiator, the second radiator is coupled to the first radiator via the gap. The antenna has at least two resonant modes. Transmission/reception of electromagnetic wave signals in a middle band (MB) and a high-band (HB), in an MB of long-term evolution (LTE) and an MB of new radio (NR), or in an HB of LTE and an HB of NR is supported by the at least two resonant modes cooperatively at the same moment.

19 Claims, 11 Drawing Sheets

(58) Field of Classification Search
CPC .......... H01Q 1/36; H01Q 1/244; H01Q 1/243;
H01Q 1/2291; H01Q 5/357; H01Q 5/40;
H01Q 5/50; H01Q 21/30; H01Q 5/328;
H01Q 5/10; H01Q 1/22; H01Q 1/2258;
H01Q 1/242; H01Q 1/48; H01Q 5/28;
H01Q 23/00
See application file for complete search history.

(56) References Cited

FOREIGN PATENT DOCUMENTS

| | | |
|---|---|---|
| CN | 108270082 | 7/2018 |
| CN | 108767450 | 11/2018 |
| CN | 108963445 | 12/2018 |
| CN | 109346831 | 2/2019 |
| CN | 109449575 | 3/2019 |
| CN | 109546305 | 3/2019 |
| CN | 109659693 | 4/2019 |
| CN | 107039766 | 7/2019 |
| CN | 110165373 | 8/2019 |
| CN | 212114006 | 12/2020 |
| CN | 112531340 | 3/2021 |
| CN | 112751204 | 5/2021 |
| CN | 214099892 | 8/2021 |
| EP | 4270646 | 11/2023 |
| EP | 4270648 | 11/2023 |

OTHER PUBLICATIONS

EPO, Extended European Search Report for EP Application No. 22787353.6, Aug. 14, 2024.
WIPO, International Search Report and Written Opinion for International Application No. PCT/CN2022/082912, Apr. 25, 2022.
CNIPA, First Office Action for CN Application No. 202110396848.0, Mar. 14, 2025.

* cited by examiner

ANTENNA AND ELECTRONIC DEVICE

CROSS-REFERENCE TO RELATED APPLICATION(S)

This application is a continuation of International Application No. PCT/CN2022/082912, filed Mar. 25, 2022, which claims priority to Chinese Patent Application No. 202110396848.0, filed Apr. 13, 2021, the entire disclosures of which are incorporated herein by reference.

TECHNICAL FIELD

This disclosure relates to the field of communication technologies, and in particular, to an antenna and an electronic device.

BACKGROUND

With the development of technologies, electronic devices like mobile phones that have communication functions become more and more popular, and the functions are increasingly powerful. An electronic device generally includes an antenna assembly to implement the communication function of the electronic device. However, in the related art, the communication performance of the antenna assembly in the electronic device is not good enough, and there is still room for improvement.

SUMMARY

In the first aspect of the disclosure, an antenna is provided. The antenna includes a first radiator, a matching circuit, a first adjustment circuit, a signal source, and a second radiator. The first radiator has a first ground end, a first free end, and a feed point between the first ground end and the first free end. The matching circuit is connected to the first radiator via the feed point. The first adjustment circuit is electrically connected to the matching circuit, the first adjustment circuit includes a switch unit and multiple adjustment sub-circuits, and the switch unit electrically connects at least one adjustment sub-circuit to the matching circuit. The signal source is electrically connected to the matching circuit. A gap is defined between the second radiator and the first radiator, the second radiator is coupled to the first radiator via the gap, the second radiator has a second ground end and a second free end, the second free end is closer to the gap than the second ground end, and the antenna has at least two resonant modes. Transmission/reception of electromagnetic wave signals in a middle band (MB) and a high-band (HB) is supported by the at least two resonant modes cooperatively at the same moment, or transmission/reception of electromagnetic wave signals in an MB of long-term evolution (LTE) and an MB of new radio (NR) is supported by the at least two resonant modes cooperatively at the same moment, or transmission/reception of electromagnetic wave signals in an HB of LTE and an HB of NR is supported by the at least two resonant modes cooperatively at the same moment.

In the second aspect of the disclosure, an electronic device is provided. The electronic device includes the antenna mentioned in the first aspect.

Other features and aspects of the disclosed features will become apparent from the following detailed description, taken in conjunction with the accompanying drawings, which illustrate, by way of example, the features in accordance with embodiments of the disclosure. The summary is not intended to limit the scope of any embodiments described herein.

BRIEF DESCRIPTION OF THE DRAWINGS

To describe technical solutions in embodiments of the disclosure more clearly, the following will give a brief introduction to accompanying drawings required for describing embodiments. Apparently, the accompanying drawings hereinafter described are merely some embodiments of the disclosure. Based on these drawings, those of ordinary skill in the art can also obtain other drawings without creative effort.

DETAILED DESCRIPTION

Figure 1:
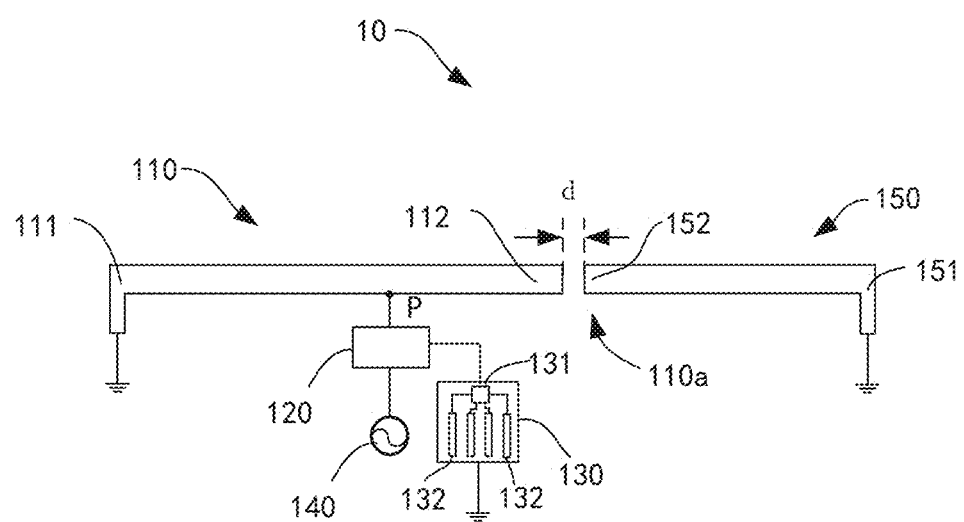
FIG. 1 is a schematic diagram of an antenna provided in an embodiment of the disclosure.

In the first aspect of the disclosure, an antenna is provided. The antenna includes a first radiator, a matching circuit, a first adjustment circuit, a signal source, and a second radiator. The first radiator has a first ground end, a first free end, and a feed point between the first ground end and the first free end. The matching circuit is connected to the first radiator via the feed point. The first adjustment circuit is electrically connected to the matching circuit and includes a switch unit and multiple adjustment sub-circuits, and the switch unit electrically connects at least one adjustment sub-circuit to the matching circuit. The signal source is electrically connected to the matching circuit. A gap is defined between the second radiator and the first radiator, the second radiator is coupled to the first radiator via the gap, the second radiator has a second ground end and a second free end, the second free end is closer to the gap than the second ground end, and the antenna has at least two resonant modes. Transmission/reception of electromagnetic wave signals in a middle band (MB) and a high-band (HB) is supported by the at least two resonant modes cooperatively at the same moment, or transmission/reception of electromagnetic wave signals in an MB of long-term evolution (LTE) and an MB of new radio (NR) is supported by the at least two resonant modes cooperatively at the same moment, or transmission/reception of electromagnetic wave signals in an HB of LTE and an HB of NR is supported by the at least two resonant modes cooperatively at the same moment.

In an embodiment, the at least two resonant modes include a first resonant mode and a second resonant mode. Current distribution in the first resonant mode is from the second ground end to the second free end and from the first free end to the first ground end. Current distribution in the second resonant mode is from the signal source to the first free end and from the second free end to the second ground end.

In an embodiment, the antenna further has a third resonant mode used to support transmission/reception of electromagnetic wave signals in an ultra-high band (UHB).

In an embodiment, current in the third resonant mode includes a first sub-current and a second sub-current, distribution of the first sub-current is from the first ground end to the first free end, and distribution of the second sub-current is from the second ground end to the second free end.

In an embodiment, the antenna further includes a second adjustment circuit electrically connected to the second radiator, and the second adjustment circuit is configured to adjust a resonant frequency point of the second resonant mode and/or a resonant frequency point of the third resonant mode.

In an embodiment, the second adjustment circuit includes a switch or a variable capacitor electrically connected to the ground.

In an embodiment, the adjustment sub-circuit includes one or more selected from a group consisting of capacitors, inductors, and resistors.

In an embodiment, the multiple adjustment sub-circuits include a first adjustment sub-circuit, a second adjustment sub-circuit, a third adjustment sub-circuit, and a fourth adjustment sub-circuit. The switch unit includes a public end, a first switch sub-unit, a second switch sub-unit, a third switch sub-unit, and a fourth switch sub-unit. The public end is electrically connected to the matching circuit, the first switch sub-unit electrically connects the first adjustment sub-circuit to the matching circuit, the second switch sub-unit electrically connects the second adjustment sub-circuit to the ground, the third switch sub-unit electrically connects the third adjustment sub-circuit to the ground, and the fourth switch sub-unit electrically connects the fourth adjustment sub-circuit to the ground.

In an embodiment, the first adjustment sub-circuit includes an adjustment capacitor. The second adjustment sub-circuit includes a first inductor. The third adjustment sub-circuit includes a second inductor. The fourth adjustment sub-circuit includes a third inductor.

In an embodiment, the matching circuit includes a first matching sub-circuit and a second matching sub-circuit. The first matching sub-circuit has one end electrically connected to the signal source, and the other end electrically connected to the first adjustment sub-circuit, and the first matching sub-circuit and the first adjustment sub-circuit are configured to adjust a capacitance of the antenna. The second matching sub-circuit has one end electrically connected to the first matching sub-circuit, and the other end electrically connected to the feed point, the second matching sub-circuit and at least one of the second adjustment sub-circuit, the third adjustment sub-circuit, or the fourth adjustment sub-circuit are cooperatively configured to adjust an inductance of the antenna.

In an embodiment, the first matching sub-circuit includes a first matching capacitor and a second matching capacitor, the first matching capacitor has one end electrically connected to the signal source, and the other end electrically connected to the second matching capacitor. A connection point between the first matching capacitor and the second matching capacitor is electrically connected to the adjustment capacitor.

In an embodiment, the second matching sub-circuit includes a first matching inductor and a second matching inductor, the first matching inductor has one end electrically connected to one end of the second matching capacitor away from the first matching capacitor, and electrically connected to the public end of the switch unit, and the first matching inductor has the other end electrically connected to the feed point. The second matching inductor has one end electrically connected to the feed point, and the other end connected to the ground.

In an embodiment, the antenna further includes a third radiator electrically connected to the matching circuit. The fourth resonant mode is supported by the third radiator. Transmission/reception of electromagnetic wave signals in a preset frequency band is supported by the fourth resonant mode, and the preset frequency band is higher than a frequency band of electromagnetic wave signals supported by the first resonant mode and the second resonant mode.

In an embodiment, the third radiator has a length ranging from $1/8$ to $1/2$ wavelength of the electromagnetic wave signals in the preset frequency band.

In an embodiment, the antenna further includes an isolation circuit electrically connected to the third radiator and the matching circuit, and the isolation circuit is configured to isolate an interference of the electromagnetic wave signals transmitted/received by the first radiator and the second radiator on the electromagnetic wave signals in the preset frequency band transmitted/received by the third radiator.

In an embodiment, the isolation circuit includes a first isolation capacitor and a second isolation capacitor. The first isolation capacitor has one end electrically connected to the matching circuit, and the other end electrically connected to the third radiator. The second isolation capacitor has one end electrically connected to the other end of the first isolation capacitor, and the other end connected to the ground.

In an embodiment, LTE NR double connect (ENDC) and/or carrier aggregation (CA) in a frequency band ranging from 1.0 GHz to 6.0 GHz is implemented by the first radiator, the second radiator, and the third radiator cooperatively.

In an embodiment, a width d of the gap satisfies: 0.5 mm≤d≤2.0 mm.

In the second aspect of the disclosure, an electronic device is provided. The electronic device includes the antenna in the first aspect or any one of embodiments of the antenna in the first aspect.

In an embodiment, the electronic device has a top and a bottom, the antenna is disposed on the top.

In an embodiment, the electronic device includes a first side and a second side connected to the first side, the first side is at the top of the electronic device, the antenna is disposed adjacent to the first side and disposed adjacent to one end the first side connected to the second side.

The following will illustrate technical solutions of embodiments of the disclosure with reference to the accompanying drawings of embodiments of the disclosure. Apparently, embodiments described herein are merely some embodiments, rather than all embodiments, of the disclosure. Based on the embodiments of the disclosure, all other embodiments obtained by those of ordinary skill in the art without creative effort shall fall within the protection scope of the disclosure.

The reference term "an embodiment" or "embodiments" referred to herein means that a particular feature, structure, or characteristic described in conjunction with an embodiment or embodiments may be contained in at least one embodiment of the disclosure. The phrase appearing in various places in the specification does not necessarily refer to the same embodiment, and is not an independent or alternative embodiment mutually exclusive with other embodiments. It is expressly and implicitly understood by those skilled in the art that an embodiment described herein may be combined with other embodiments.

Reference is made to FIG. 1, which is a schematic diagram of an antenna provided in an embodiment of the disclosure. An antenna 10 is provided in the disclosure, which may be applied to an electronic device 1. The electronic device 1 includes but is not limited to electronic devices 1 with communication functions such as a cellphone, a mobile internet device (MID), an electronic book, a play station portable (PSP), or a personal digital assistant (PDA).

The antenna 10 includes a first radiator 110, a matching circuit 120, a first adjustment circuit 130, a signal source 140, and a second radiator 150. The first radiator 110 has a first ground end 111, a first free end 112, and a feed point P between the first ground end 111 and the first free end 112. The matching circuit 120 is connected to the first radiator 110 via the feed point P. The first adjustment circuit 130 is electrically connected to the matching circuit 120, the first adjustment circuit 130 includes a switch unit 131 and multiple adjustment sub-circuits 132. The switch unit 131 electrically connects at least one adjustment sub-circuit to the matching circuit 120. The signal source 140 is electrically connected to the matching circuit 120. A gap 110a is defined between the second radiator 150 and the first radiator 110, and the second radiator 150 is coupled to the first radiator 110 via the gap 110a. The second radiator 150 has a second ground end 151 and a second free end 152. The second free end 152 is closer to the gap 110a than the second ground end 151, such that the antenna has at least two resonant modes. Transmission/reception of electromagnetic wave signals in an MB and an HB is supported by the at least two resonant modes cooperatively at the same moment, or transmission/reception of electromagnetic wave signals in an MB of LTE and an MB of NR is supported by the at least two resonant modes cooperatively at the same moment, or transmission/reception of electromagnetic wave signals in an HB of LTE and an HB of NR is supported by the at least two resonant modes cooperatively at the same moment.

It is to be noted that, transmission/reception of electromagnetic wave signals in the MB and the HB is supported by the at least two resonant modes cooperatively at the same moment, the MB may be an MB of LTE or an MB of NR, correspondingly, and the HB may be an HB of LTE or an HB of NR. Therefore, transmission/reception of electromagnetic wave signals in the MB and the HB supported by the at least two resonant modes cooperatively at the same moment includes the following. Transmission/reception of electromagnetic wave signals in the MB of LTE and the HB of LTE is supported by the at least two resonant modes cooperatively at the same moment; transmission/reception of electromagnetic wave signals in the MB of LTE and the HB of NR is supported by the at least two resonant modes cooperatively at the same moment; transmission/reception of electromagnetic wave signals in the MB of NR and the HB of LTE is supported by the at least two resonant modes cooperatively at the same moment; and transmission/reception of electromagnetic wave signals in the MB of NR and the HB of NR is supported by the at least two resonant modes cooperatively at the same moment.

It is to be noted that, the terms "first", "second", and the like used in the specification, the claims, and the accompany drawings of the disclosure are used to distinguish different objects rather than describe a particular order. In addition, the terms "include" and "have" as well as variations thereof are intended to cover non-exclusive inclusion.

The first radiator 110 may be a straight-bar-shaped radiator, or a bent radiator, or a radiator of other shapes, which is not limited in the disclosure. When the first radiator 110 is a straight-bar-shaped radiator, the first ground end 111 and the first free end 112 are two opposite ends of the first radiator 110. When the first radiator 110 is a bent radiator, for example, when the first radiator 110 includes two radiation parts connected in a bending manner, the first ground end 111 and the first free end 112 are ends of the two radiation parts respectively, the first ground end 111 is one end of one radiation part facing away from the other radiation part, and the first free end 112 is one end of the other radiation part facing away from the one radiation part.

Correspondingly, the second radiator 150 may be a straight-bar-shaped radiator, or a bent radiator, or a radiator of other shapes, which is not limited in the disclosure. When the second radiator 150 is a straight-bar-shaped radiator, the second ground end 151 and the second free end 152 are two opposite ends of the second radiator 150. When the second radiator 150 is a bent radiator, for example, when the second radiator 150 includes two radiation parts connected in a bending manner, the second ground end 151 and the second free end 152 are ends of the two radiation parts respectively, the second ground end 151 is one end of one radiation part facing away from the other radiation part, and the second free end 152 is one end of the other radiation part facing away from the one radiation part.

The first radiator 110 may be a flexible printed circuit (FPC) antenna radiator a laser direct structuring (LDS) antenna radiator, a print direct structuring (PDS) antenna radiator, or a metal branch. The second radiator 150 may be an FPC antenna radiator, an LDS antenna radiator, a PDS antenna radiator, or a metal branch.

In an embodiment, the type of the first radiator and the second radiator may be the same to facilitate preparation. In another embodiment, as long as electromagnetic wave signals can be transmitted/received, the type of the first radiator and the type of the second radiator may be different.

The second free end 152 and the first free end 112 are spaced apart from each other to define the gap 110a, and the second radiator 150 is coupled to the first radiator 110. That is, the antenna 10 may transmit/receive electromagnetic wave signals not only by the first radiator 110, but also by the second radiator 150. Specifically, an excitation signal generated by the signal source 140 is loaded to the first radiator 110 via the feed point P and coupled to the second radiator 150 via the gap 110a. Therefore, the antenna 10 may operate in a wide frequency band. In addition, since the second free end 152 and the first free end 112 are spaced apart from each other to define the gap 110a, and the second radiator 150 is coupled to the first radiator 110, the size of the antenna 10 may be reduced. When the antenna 10 is applied to the electronic device 1, a stacking space in which the antenna 10 is stacked in the electronic device 1 may be reduced.

In the related art, an antenna 10 may only transmit/receive electromagnetic wave signals in one frequency band at the same moment. Another antenna 10 should be disposed additionally to support transmission/reception of electromagnetic wave signals in one of two frequency bands if electromagnetic wave signals in the two frequency bands are needed to be transmitted/received. Thus, in the related art, a larger number of antennas 10 are required to support transmission/reception of electromagnetic wave signals in multiple frequency bands, resulting in a larger volume of all antennas 10, i.e., the sum of volumes of all antennas 10 is large. When all the antennas 10 are applied to the electronic device 1, the difficulty increases for the antennas 10 to stack with other components since the sum of the volume of all the antennas 10 is large. Also, disposing an additional antenna 10 to support transmission/reception of electromagnetic wave signals in one of the frequency bands may result in an increase in radio frequency (RF) link insertion loss of the antennas 10. The antenna 10 provided in the disclosure has at least two resonant modes, which are used to support transmission/reception of electromagnetic wave signals in an MB and an HB at the same moment, or support transmission/reception of electromagnetic wave signals in an MB of LTE and an MB of NR at the same moment, or support transmission/reception of electromagnetic wave signals in an HB of LTE and an HB of NR at the same moment. Thus, with the coupling of the first radiator 110 and the second radiator 150 and the at least two resonant modes excited by the coupling, the antenna 10 provided in the disclosure may transmit/receive electromagnetic wave signals in multiple frequency bands and has better communication effect. Therefore, the antenna 10 provided in the disclosure does not need another antenna 10 to support one of the frequency bands. Therefore, when transmitting/receiving electromagnetic wave signals in the same frequency band, the size of the antenna 10 of the disclosure is smaller than the sum of the volumes of all antennas 10 capable of supporting the same frequency band in the related art. When the antenna 10 is applied to the electronic device 1, it is less difficult for the antenna 10 to stack with other components. Moreover, in the disclosure, there is no other antenna 10 provided to support transmission/reception of electromagnetic wave signals in one of the frequency bands. Compared to providing multiple antennas 10 to each support transmission/reception of electromagnetic wave signals in one of the frequency bands, the RF link insertion loss of the antenna 10 provided in the disclosure is smaller.

The signal source 140 is configured to generate an excitation signal, which is loaded to the feed point P via the matching circuit 120. Since current distribution of the excitation signal on the first radiator 110 and the second radiator 150 is different, the antenna 10 may support transmission/reception of electromagnetic wave signals in different frequency bands. The matching circuit 120 is configured to adjust an output impedance of the signal source 140 and an input impedance of the first radiator 110, resulting in higher radiation efficiency of the antenna 10. A function of the first adjustment circuit 130 will be described in detail later with a specific structure of the first adjustment circuit 130. The two resonant modes will be described and explained in detail later with reference to FIG. 2. The MB and the HB may also be referred to as middle high band (MHB), and the range of the MHB is from 1.0 GHz to 3.0 GHz.

In the embodiment, the gap 110a is defined between the first radiator 110 and the second radiator 150, the second radiator 150 is coupled to the first radiator 110 via the gap 110a, then the two resonant modes of the antenna 10 are excited. Therefore, the antenna 10 may support transmission/reception of the electromagnetic wave signals in the MB and the HB at the same moment, or support transmission/reception of electromagnetic wave signals in the MB of LTE and the MB of NR at the same moment, or support transmission/reception of electromagnetic wave signals in the HB of LTE and the HB of NR at the same moment. That is, in an embodiment, the antenna 10 may support transmission/reception of electromagnetic wave signals in the MB and transmission/reception of electromagnetic wave signals in the HB at the same moment. Or in another embodiment, the antenna 10 may support transmission/reception of electromagnetic wave signals in the MB of LTE and transmission/reception of electromagnetic wave signals in the HB of NR at the same moment. Or in another embodiment, the antenna 10 may support transmission/reception of electromagnetic wave signals in the HB of LTE and transmission/reception of electromagnetic wave signals in the HB of NR at the same moment. Therefore, the antenna 10 provided in the disclosure may support a wide frequency band at the same moment, and the electronic device 1 with the antenna 10 has better communication performance.

Reference is further made to FIG. 1, a width d of the gap 110a satisfies: 0.5 mm≤d≤2.0 mm. The width d of the gap 110a between the first radiator 110 and the second radiator 150 is selected from the above range, ensuring a good coupling effect between the first radiator 110 and the second radiator 150. The width d may further satisfy: 0.5 mm≤d≤1.5 mm, for better coupling effect between the first radiator 110 and the second radiator 150.

Figure 2:
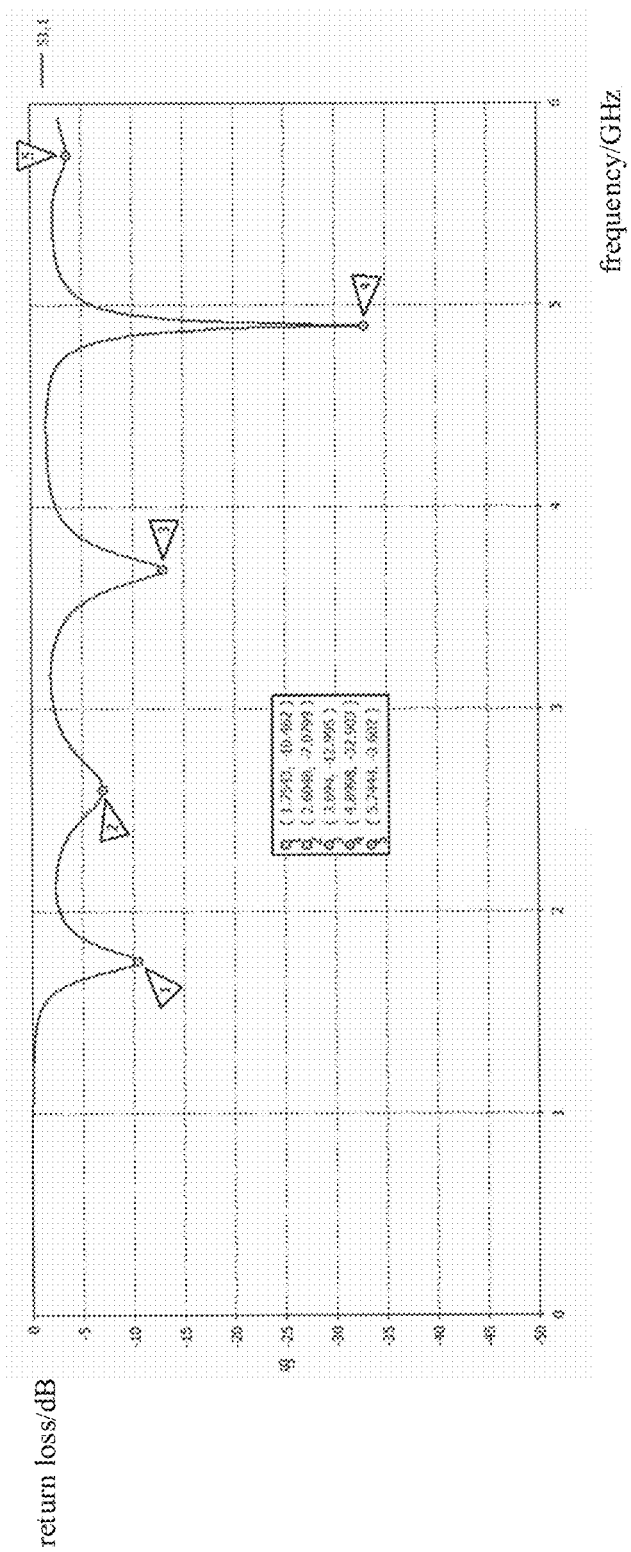
FIG. 2 is a schematic diagram of return loss of an antenna provided in an embodiment of the disclosure.

Reference is made to FIG. 2, which is a schematic diagram of return loss of an antenna provided in an embodiment of the disclosure. Return loss, short for RL, is a kind of S-Parameters. In the embodiment, the abscissa represents the frequency in GHz and the ordinate represents the return loss in dB. Reference is made to FIG. 2, the at least two resonant modes include a first resonant mode and a second resonant mode. The resonant mode is also called resonant model. Point 1 in the figure represents a resonant frequency point of the first resonant mode, and point 2 represents a resonant frequency point of the second resonant mode. As illustrated in the schematic diagram, the frequency band supported by the first resonant mode and the second resonant mode ranges from 1.45 GHz to 2.7 GHz.

Figure 3:
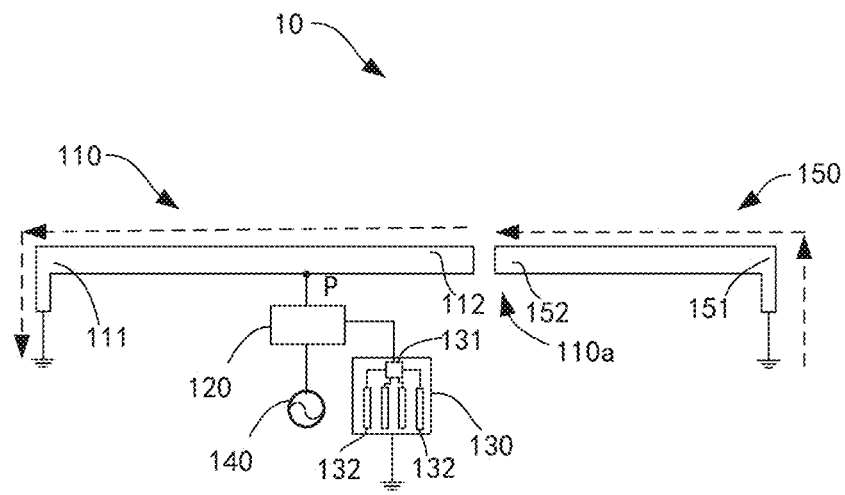
FIG. 3 is a schematic diagram of current distribution in the first resonant mode.
Figure 4:
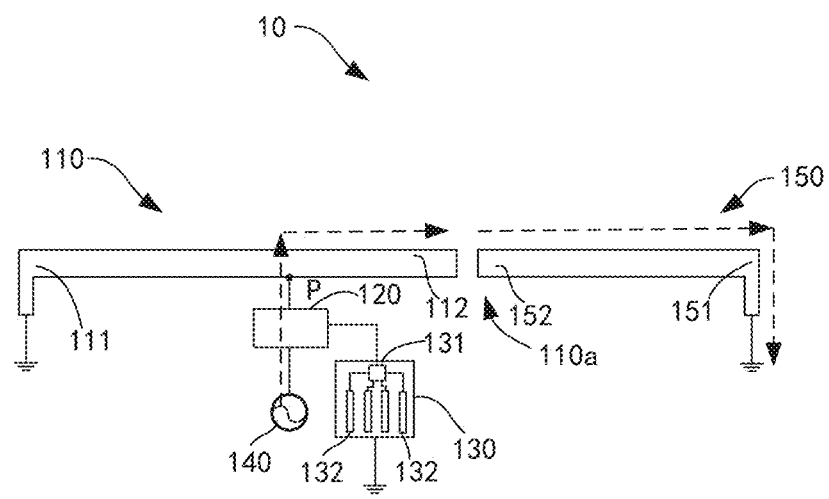
FIG. 4 is a schematic diagram of current distribution in the second resonant mode.

Reference is made to FIG. 3 and FIG. 4, where FIG. 3 is a schematic diagram of current distribution in the first resonant mode and FIG. 4 is a schematic diagram of current distribution in the second resonant mode. As illustrated in FIG. 3, current distribution in the first resonant mode is from the second ground end 151 to the first ground end 111. As illustrated in FIG. 4, current distribution in the second resonant mode is from the signal source 140 to the second ground end 151.

In other words, current distribution in the first resonant mode is from the second ground end 151 to the second free end 152, and from the first free end 112 to the first ground end 111. Specifically, current distribution in the first resonant mode is from the second ground end 151 to the second free end 152, from the second free end 152 to the first free end 112 through the coupling between the first free end 112 and the second free end 152, and then from the first free end 112 to the first ground end 111.

In other words, current distribution in the second resonant mode is from the signal source 140 to the first free end 112, and from the second free end 152 to the second ground end 151. Specifically, current distribution in the second resonant mode is from the signal source 140 to the feed point P, from the feed point P to the first free end 112, from the first free end 112 to the second free end 152 through the coupling between the first free end 112 and the second free end 152, and then from the second free end 152 to the second ground end 151.

Reference is further made to FIG. 2, the antenna 10 further includes the third resonant mode. As illustrated in FIG. 2, point 3 represents a resonant frequency point of the third resonant mode. The third resonant mode is used to support transmission/reception of electromagnetic wave signals in an ultra high band (UHB). The range of UHB is from 3.0 GHz to 6.0 GHz. As illustrated in FIG. 2, point 3 represents the resonant frequency point of the third resonant mode, and the frequency band of electromagnetic wave signals supported by the third resonant mode is greater than 3.0 GHz, which means the third resonant mode supports transmission/reception of electromagnetic wave signals in the UHB.

Figure 5:
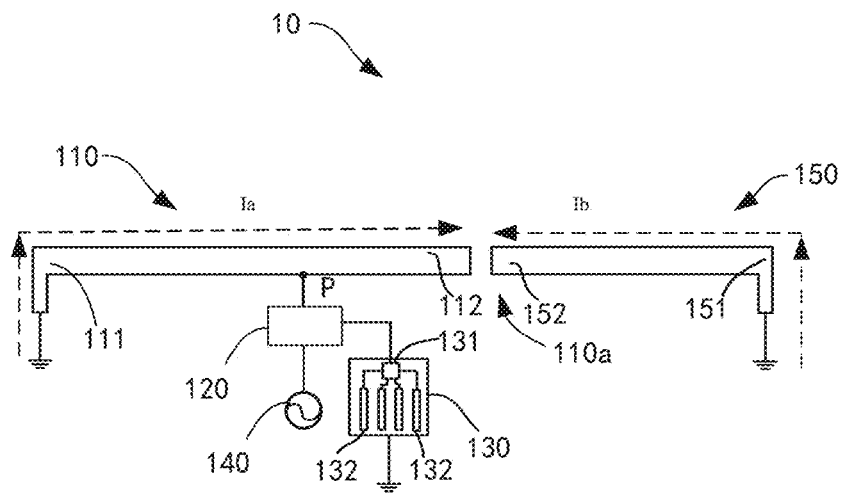
FIG. 5 is a schematic diagram of current distribution in the third resonant mode.

Reference is made to FIG. 5, which is a schematic diagram of current distribution in the third resonant mode. Current in the third resonant mode includes a first sub-current Ia and a second sub-current Ib. Distribution of the first sub-current Ia is from the first ground end 111 to the first free end 112, and distribution of the second sub-current Ib is from the second ground end 151 to the second free end 152.

Figure 6:
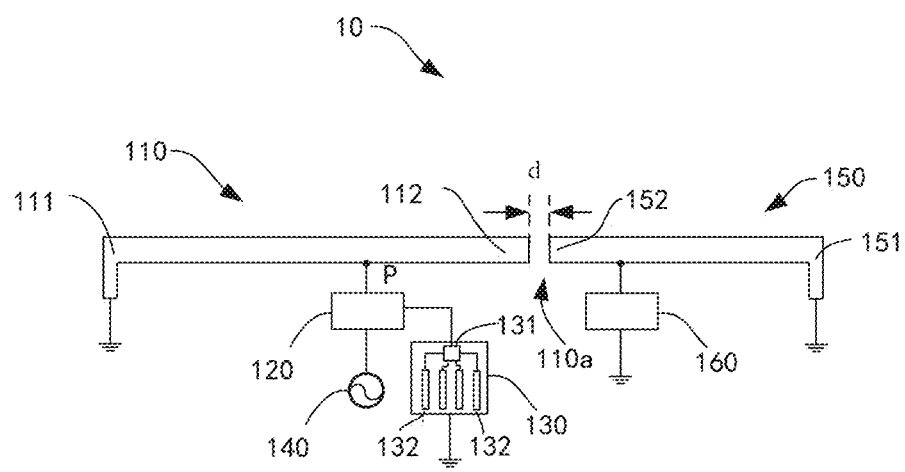
FIG. 6 is a schematic diagram of an antenna provided in another embodiment of the disclosure.

Reference is made to FIG. 6, which is a schematic diagram of an antenna provided in another embodiment of the disclosure. The antenna 10 also includes a second adjustment circuit 160. The second adjustment circuit 160 is electrically connected to the second radiator 150 and configured to adjust a resonant frequency point of the second resonant mode and/or a resonant frequency point of the third resonant mode. The second adjustment circuit 160 further included in the antenna 10 may be incorporated into the antenna described in any of the previous embodiments.

In an embodiment, the second adjustment circuit 160 includes a switch or a variable capacitor electrically connected to the ground.

In an embodiment, the adjustment sub-circuit 132 includes one or more selected from a group consisting of capacitors, inductors, and resistors.

Figure 7:
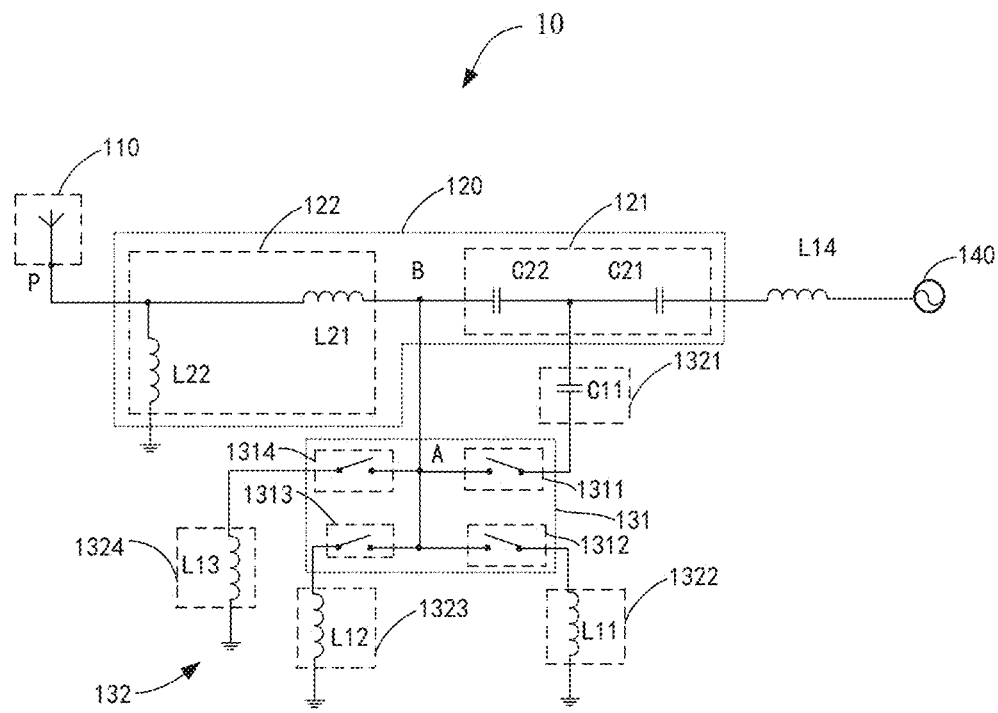
FIG. 7 is a partial schematic circuit diagram of an antenna provided in an embodiment of the disclosure.

Reference is made to FIG. 7, which is a partial schematic circuit diagram of an antenna provided in an embodiment of the disclosure. The second radiator 150 is left out in the schematic diagram. The multiple adjustment sub-circuits 132 include a first adjustment sub-circuit 1321, a second adjustment sub-circuit 1322, a third adjustment sub-circuit 1323, and a fourth adjustment sub-circuit 1324. The switch unit 131 includes a public end A, a first switch sub-unit 1311, a second switch sub-unit 1312, a third switch sub-unit 1313, and a fourth switch sub-unit 1314. The public end A is electrically connected to the matching circuit 120. The first switch sub-unit 1311 electrically connects the first adjustment sub-circuit 1321 to the matching circuit 120. The second switch sub-unit 1312 electrically connects the second adjustment sub-circuit 1322 to the ground. The third switch sub-unit 1313 electrically connects the third adjustment sub-circuit to the ground. The fourth switch sub-unit 1314 electrically connects the fourth adjustment sub-circuit to the ground.

When the first switch sub-unit 1311 is turned on, the first adjustment sub-circuit 1321 is electrically connected to the matching circuit 120; and when the first switch sub-unit 1311 is turned off, the first adjustment sub-circuit 1321 disconnects from the matching circuit 120. When the second switch sub-unit 1312 is turned on, the second adjustment sub-circuit 1322 is electrically connected to the matching circuit 120; and when the second switch sub-unit 1312 is turned off, the second adjustment sub-circuit 1322 disconnects from the matching circuit 120. When third switch sub-unit 1313 is turned on, the third adjustment sub-circuit 1323 is electrically connected to the matching circuit 120; and when the third switch sub-unit 1313 is turned off, the third adjustment circuit 1323 disconnects from the matching circuit 120. When the fourth switch sub-unit 1314 is turned on, the fourth adjustment sub-circuit 1324 is electrically connected to the matching circuit 120; and when the fourth switch sub-unit 1314 is turned off, the fourth adjustment sub-circuit 1324 disconnects from the matching circuit 120.

In an embodiment, the first adjustment sub-circuit 1321 includes an adjustment capacitor C11. The second adjustment sub-circuit 1322 includes a first inductor L11. The third adjustment sub-circuit 1323 includes a second inductor L12. The fourth adjustment sub-circuit 1324 includes a third inductor L13.

In an embodiment, the inductance of the first inductor L11, the inductance of the second inductor L12, and the inductance of the third inductor L13 are all different. Therefore, when the inductance of the first inductor L11, the inductance of the second inductor L12, and the inductance of the third inductor L13 are all different, the inductance is different when one of the following is electrically connected to the matching circuit 120: the first inductor L11, the second inductor L12, the third inductor L13, a combination of the first inductor L11 and the second inductor L12, a combination of the first inductor L11 and the third inductor L13, a combination of the second inductor L12 and the third inductor L13, or a combination of the first inductor L11, the second inductor L12, and the third inductor L13. Therefore, different combinations of inductance may be achieved, thereby achieving different LC resonances.

Reference is further made to FIG. 7, the matching circuit 120 includes a first matching sub-circuit 121 and a second matching sub-circuit 122. The first matching sub-circuit 121 has one end electrically connected to the signal source 140 and the other end electrically connected to the first adjustment sub-circuit 1321. The first matching sub-circuit 121 and the first adjustment sub-circuit 1321 are configured to adjust the capacitance of the antenna 10. The second matching sub-circuit 122 has one end electrically connected to the first matching sub-circuit 121 and the other end electrically connected to the feed point P. The second matching sub-circuit 122 and at least one of the second adjustment sub-circuit 1322, the third adjustment sub-circuit 1323, or the fourth adjustment sub-circuit 1324 are cooperatively configured to adjust the inductance of the antenna 10. In other words, the second matching sub-circuit 122 and at least one of the adjustment sub-circuits are cooperatively configured to adjust the inductance of the antenna 10, where the adjustment sub-circuits include the second adjustment sub-circuit 1322, the third adjustment sub-circuit 1323, and the fourth adjustment sub-circuit 1324.

The first matching sub-circuit 121 and the first adjustment sub-circuit 1321 are configured to adjust the capacitance of the antenna 10. The second matching sub-circuit 122 and at least one adjustment sub-circuits 132 of the second adjustment sub-circuit 1322, the third adjustment sub-circuit 1323, or the fourth adjustment sub-circuit 1324 are cooperatively configured to adjust the inductance of the antenna 10.

Therefore, the antenna 10 may have different LC resonances with different inductance and capacitance, and the antenna 10 may resonate at different frequency points.

In the embodiment, the first matching sub-circuit 121 includes a first matching capacitor C21 and a second matching capacitor C22. The first matching capacitor C21 has one end electrically connected to the signal source 140 and the other end electrically connected to the second matching capacitor C22. The first matching capacitor C21 and the second matching capacitor C22 have a connection point electrically connected to the adjustment capacitor C11.

Since the first switch sub-unit 1311 is electrically connected to the first adjustment sub-circuit 1321, when the first switch sub-unit 1311 is turned on, the adjustment capacitor C11 has one end electrically connected to the connection point between the first matching capacitor C21 and the second matching capacitor C22, and has the other end electrically connected to an end point of the second matching capacitor C22 far away from the first matching capacitor C21 (i.e., the end point marked as point B in the schematic diagram). When the first switch sub-unit 1311 is turned off, the other end of the adjustment capacitor C11 is electrically disconnected from the end of the second matching capacitor C22 far from the first matching capacitor C21. In other words, the adjustment capacitor C11 is electrically disconnected from point B. Therefore, the turning on and off of the first switch unit 131 will lead to the change of capacitance in the antenna 10.

The second matching sub-circuit 122 includes a first matching inductor L21 and a second matching inductor L22. The first matching inductor L21 has one end electrically connected to the end of the second matching capacitor C22 far away from the first matching capacitor C21 (i.e., point B), and electrically connected to the public end A of the switch unit 131. The first matching inductor L21 has the other end electrically connected to the feed point P. The second matching inductor L22 has one end electrically connected to the feed point P, and the other end connected to the ground.

Since the second adjustment sub-circuit 1322 includes the first inductor L11, the third adjustment sub-circuit 1323 includes the second inductor L12, the fourth adjustment sub-circuit 1324 includes the third inductor L13, and the second matching sub-circuit 122 includes the first matching inductor L21 and the second matching inductor L22, when any one or any combination of the second adjustment sub-circuit 1322, the third adjustment sub-circuit 1323, or the fourth adjustment sub-circuit 1324 is electrically connected to the public end A, the adjustment sub-circuit and the second matching sub-circuit 122 will cooperatively generate different inductance.

Optionally, in the embodiment, the antenna 10 further includes a fourth inductor L14. The fourth inductor L14 has one end electrically connected to the signal source 140, and the other end electrically connected to the first matching sub-circuit 121. The fourth inductor L14 is configured to adjust the inductance of the antenna 10 cooperatively with the second matching sub-circuit 122, the second adjustment sub-circuit 1322, the third adjustment sub-circuit 1323, and the fourth adjustment sub-circuit 1324.

In another embodiment, the inductance of the fourth inductor L14 may be zero, which means the fourth inductor L14 is not included in the antenna 10.

Figure 8:
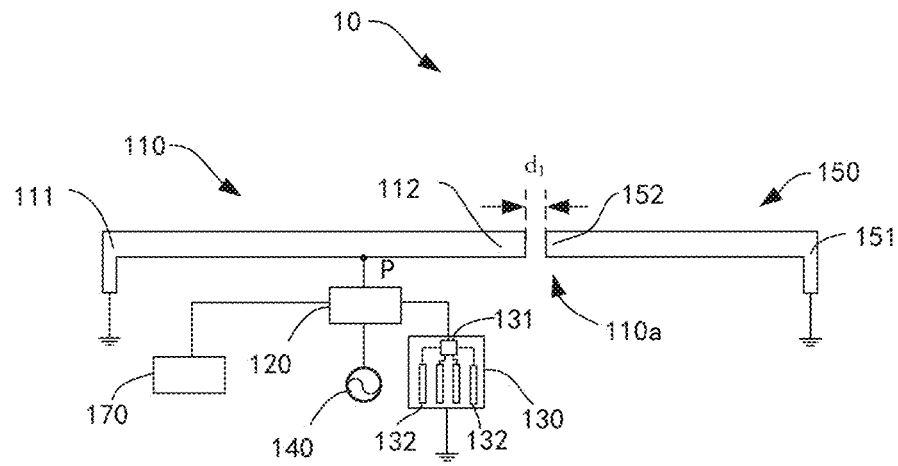
FIG. 8 is a schematic diagram of an antenna provided in another embodiment of the disclosure.

Reference is made to FIG. 2 and FIG. 8, where FIG. 8 is a schematic diagram of an antenna provided in another embodiment of the disclosure. In the embodiment, the antenna 10 includes the first radiator 110, the matching circuit 120, the first adjustment circuit 130, the signal source 140, and the second radiator 150. In the embodiment, the antenna 10 further includes a third radiator 170. The third radiator 170 is electrically connected to the matching circuit 120 and configured to support a fourth resonant mode (referring to FIG. 2, point 4 represents the resonant frequency point of the fourth resonant mode). The fourth resonant mode is used to support transmission/reception of electromagnetic wave signals in a preset frequency band. The preset frequency band is higher than the frequency band of electromagnetic wave signals supported by the first resonant mode and the second resonant mode. In the embodiment, the preset frequency band is also higher than the frequency band of electromagnetic wave signals supported by the third resonant mode.

The third radiator 170 may be a FPC antenna radiator, an LDS antenna radiator, a PDS antenna radiator, or a metal branch.

In an embodiment, the types of the first radiator 110, the second radiator 150, and the third radiator 170 may be the same to facilitate preparation. In another embodiment, as long as electromagnetic wave signals can be transmitted/received, the types of the first radiator 110, the second radiator 150, and the third radiator 170 may be different.

In the embodiment, the third radiator 170 has a length ranging from $1/8$ to $1/2$ wavelength of electromagnetic wave signals in the preset frequency band. The length of the third radiator 170 ranges from $1/8$ to $1/2$ wavelength of electromagnetic wave signals in the preset frequency band, so that the length of the third radiator 170 matches electromagnetic wave signals in the preset frequency band, and the third radiator will have a good radiation efficiency when transmitting/receiving electromagnetic wave signals in the preset frequency band.

In an embodiment, the preset frequency band is in the UHB. For example, the preset frequency band is an N79 frequency band (4.4 GHz~5.0 GHz).

Figure 9:
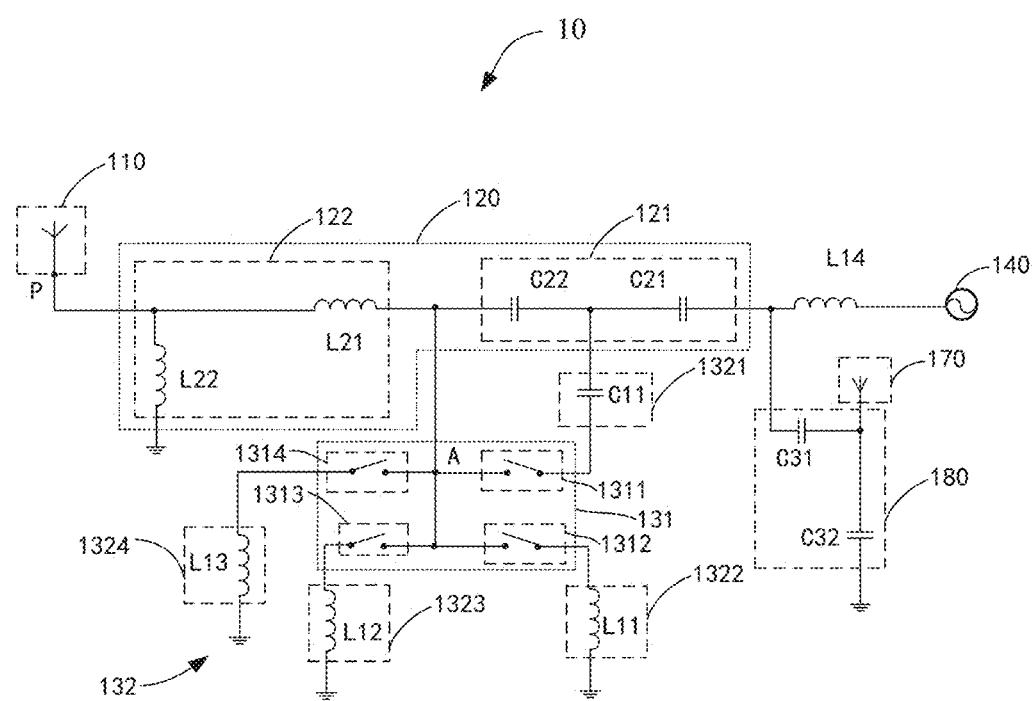
FIG. 9 is a partial schematic circuit diagram of an antenna provided in another embodiment of the disclosure.

Reference is made to FIG. 9, which is a partial schematic circuit diagram of an antenna provided in another embodiment of the disclosure. The antenna 10 also includes an isolation circuit 180. The isolation circuit 180 is electrically connected to the third radiator 170 and the matching circuit 120, and the isolation circuit 180 is configured to isolate an interference of electromagnetic wave signals transmitted/received by the first radiator 110 and the second radiator 150 on electromagnetic wave signals in the preset frequency band transmitted/received by the third radiator 170. In the embodiment, for illustrative purpose, the isolation circuit 180 of the antenna 10 is combined to FIG. 7, and it is to be understood that it should not constitute a limitation to the antenna provided in the embodiment.

The third radiator 170 is configured to support the fourth resonant mode, the fourth resonant mode is used to support transmission/reception of electromagnetic wave signals in the preset frequency band, and the preset frequency band is higher than the frequency band of electromagnetic wave signals supported by the first resonant mode, the second resonant mode, and the third resonant read, which means the preset frequency band is a high frequency band. Therefore, the isolation circuit 180 is electrically connected to the third radiator 170 and the matching circuit 120, and the isolation circuit 180, for other frequency bands, is equivalent to a smaller capacitor connected in parallel. Therefore, on one hand, the isolation circuit 180 may isolate an interference of electromagnetic wave signals transmitted/received by the first radiator 110 and the second radiator 150 on electromagnetic wave signals in the frequency band transmitted and received by the third radiator 170, on the other hand, reduce the impact on electromagnetic wave signals transmitted/received by the first radiator 110 and the second radiator 150.

In the embodiment, the isolation circuit 180 includes a first isolation capacitor C31 and a second isolation capacitor C32. The first isolation capacitor C31 has one end electrically connected to the matching circuit 120 and the other end electrically connected to the third radiator 170. The second isolation capacitor C32 has one end electrically connected to the other end of the first isolation capacitor C31, and the second isolation capacitor C32 has the other end connected to the ground.

It is to be noted that, the matching capacitor described earlier is also known as a capacitor, the isolation capacitor is also known as a capacitor, and the matching inductor is also known as an inductor. Due to the limitations of the actual specifications of capacitors, one or more capacitors may be required to achieve a preset capacitance. In the embodiment, the isolation circuit 180 includes the first isolation capacitor C31 and the second isolation capacitor C32, which is beneficial for selecting suitable capacitors to achieve the above capacitance.

Figure 10:
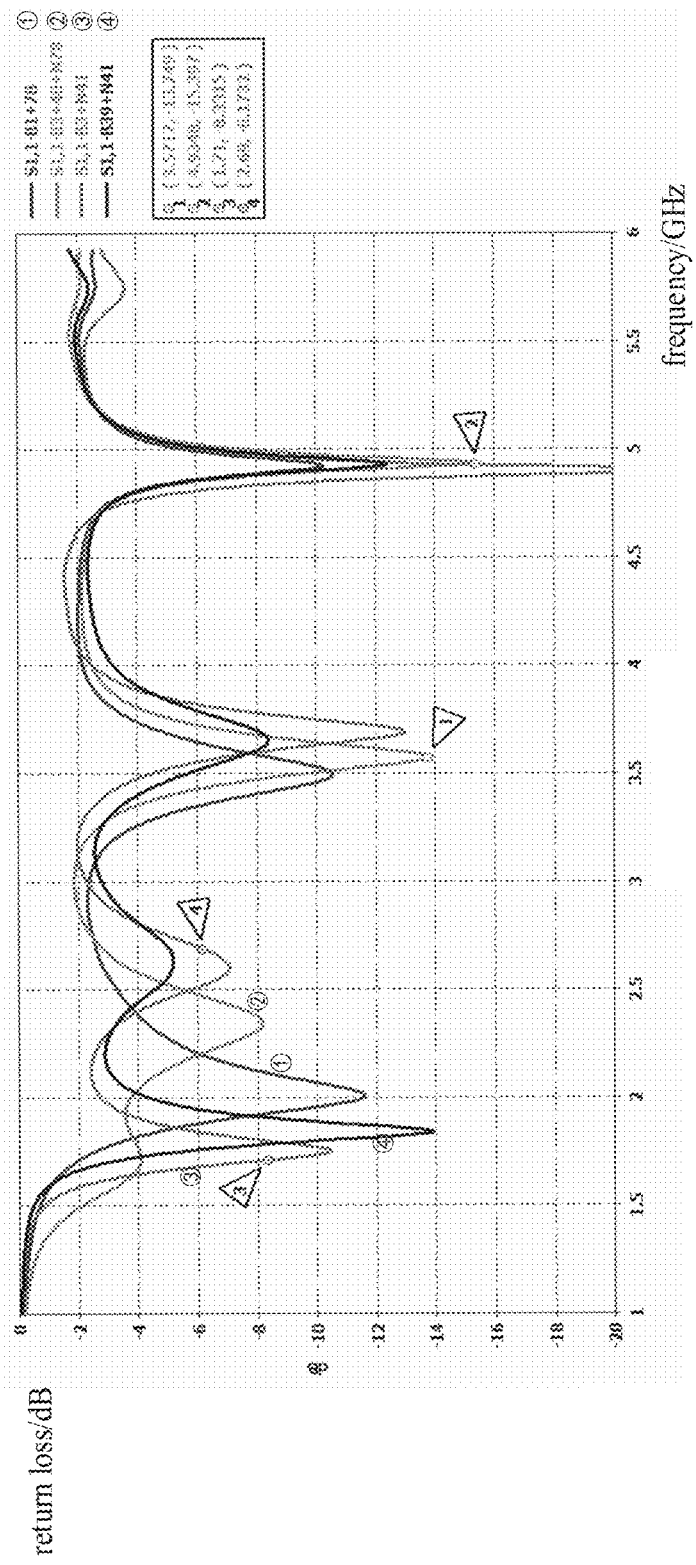
FIG. 10 is a schematic diagram of return loss of an antenna provided in an embodiment of the disclosure.

The electromagnetic wave signals transmitted/received by the antenna 10 provided in an embodiment of the disclosure will be described in the following with reference to the simulation diagrams. Reference is made to FIG. 2 and FIG. 10, where FIG. 10 is a schematic diagram of return loss of an antenna provided in an embodiment of the disclosure. The schematic diagram of FIG. 10 is simulated on the basis of the structure of the antenna 10 in FIG. 8 and the circuit of the antenna 10 in FIG. 11. In the embodiment, the abscissa represents the frequency in GHz and the ordinate represents the return loss in dB. There are four curves in the schematic diagram, which are labeled as Curve①, Curve②, Curve③ and Curve④. Curve①, Curve②, Curve③ and Curve④ respectively represent return loss when the switch unit 131 is in different states, that is, four curves correspond to four states of the switch unit 131. It is to be noted that since the switch unit 131 includes the first switch sub-unit 1311, the second switch sub-unit 1312, the third switch sub-unit 1313, and the fourth switch sub-unit 1314, the states of the first switch sub-unit 1311, the second switch sub-unit 1312, the third switch sub-unit 1313, and the fourth switch sub-unit 1314 of the switch unit 131 are different in turning on or off, resulting in different states of the switch unit 131. As illustrated in the schematic diagram, the antenna 10 may transmit/receive electromagnetic wave signals ranging from 1.0 GHz to 6.0 GHz. Therefore, the antenna 10 may cover frequency bands B3, B39, B1, B7, N41, N77, N78, N79, and other frequency bands of the same frequency. Therefore, the antenna 10 of the disclosure may support the coverage of electromagnetic wave signals in a wider frequency band.

Referring to the left first resonant mode (first resonant mode) of curve③ and the left first resonant mode (first resonant mode) of curve④, compared with the first resonant mode of curve③, the first resonant mode of curve④ shifts to the right, and the resonant frequency point of the first resonant mode of curve④ (the lowest point of the first resonant mode) is closer to the resonant frequency point of the B39 (from 1.88 GHz to 1.92 GHz) than that of the first resonant mode of curve③. Therefore, the B39 may be better covered by changing the state of the switching unit 131. For electromagnetic wave signals in other frequency bands, the antenna 10 may better cover each frequency band by switching the state of the switch unit 131.

In addition, as illustrated in point 3 and point 4 of the schematic diagram, the antenna 10 has two resonant modes in a frequency band ranging from 1.45 GHz to 2.7 GHz. Therefore, a wider frequency band can be covered in the frequency band ranging from 1.45 GHz to 2.7 GHz, which means the antenna 10 is a wideband antenna in the frequency band ranging from 1.45 GHz to 2.7 GHz. The frequency band of electromagnetic wave signals transmitted/received by the antenna 10 may be adjusted by adjusting a matching value of the matching circuit 120.

Figure 11:
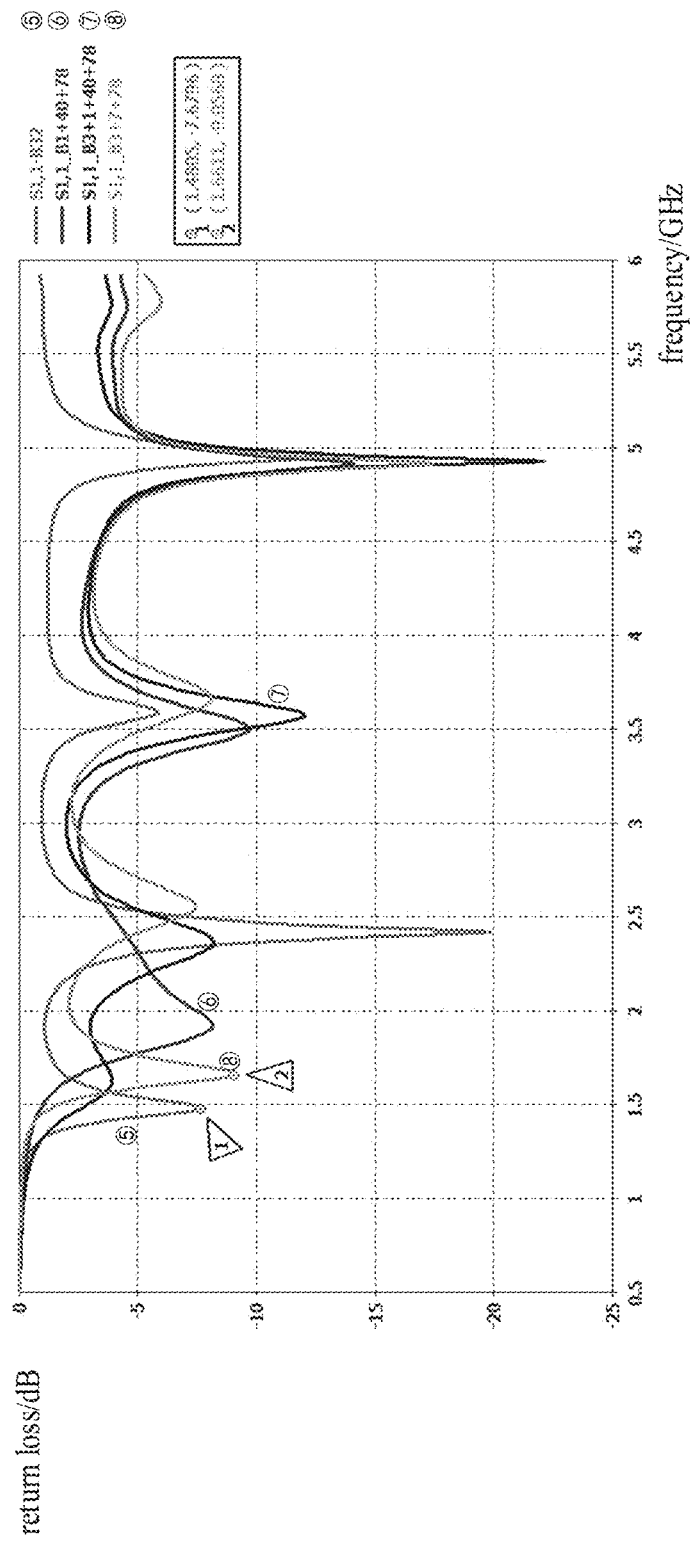
FIG. 11 is a schematic diagram of return loss of an antenna provided in an embodiment of the disclosure.

Reference is made to FIG. 11, which is a schematic diagram of return loss of an antenna provided in an embodiment of the disclosure. In the embodiment, the abscissa represents the frequency in GHz and the ordinate represents the return loss in dB. According to different matching values, there are four curves in the schematic diagram, which are labeled as Curve⑤, Curve⑥, Curve⑦, and Curve⑧. Curve⑤, Curve⑥, Curve⑦, and Curve⑧ respectively correspond to different matching values of the matching circuit 120. In the schematic diagram, the frequency corresponding to point 1 is 1.4805 GHz, and the frequency corresponding to point 2 is 1.6611 GHz. As illustrated from point 1 and point 2 in the schematic diagram, the frequency range covered by point 1 and point 2 ranges from 1.45 GHz to 1.70 GHz. Therefore, the antenna 10 may cover the 1.5 GHz frequency band corresponding to B32 (from 1.452 GHz to 1.496 GHz) and N75 (from 1.432 GHz to 1.517 GHz).

As can be seen from the above analysis, by adjusting the state of the switch unit 131 and the matching value of the matching circuit 120, the first radiator 110, the second radiator 150, and the third radiator 170 may cooperatively implement LTE NR double connect (ENDC) of the fourth generation mobile communication technology (4G) signals and the fifth generation mobile communication technology (5G) signals in the frequency ranging from 1.0 GHz to 6.0 GHz, and/or the carrier aggregation (CA) of 4G signals or 5G signals.

Figure 12:
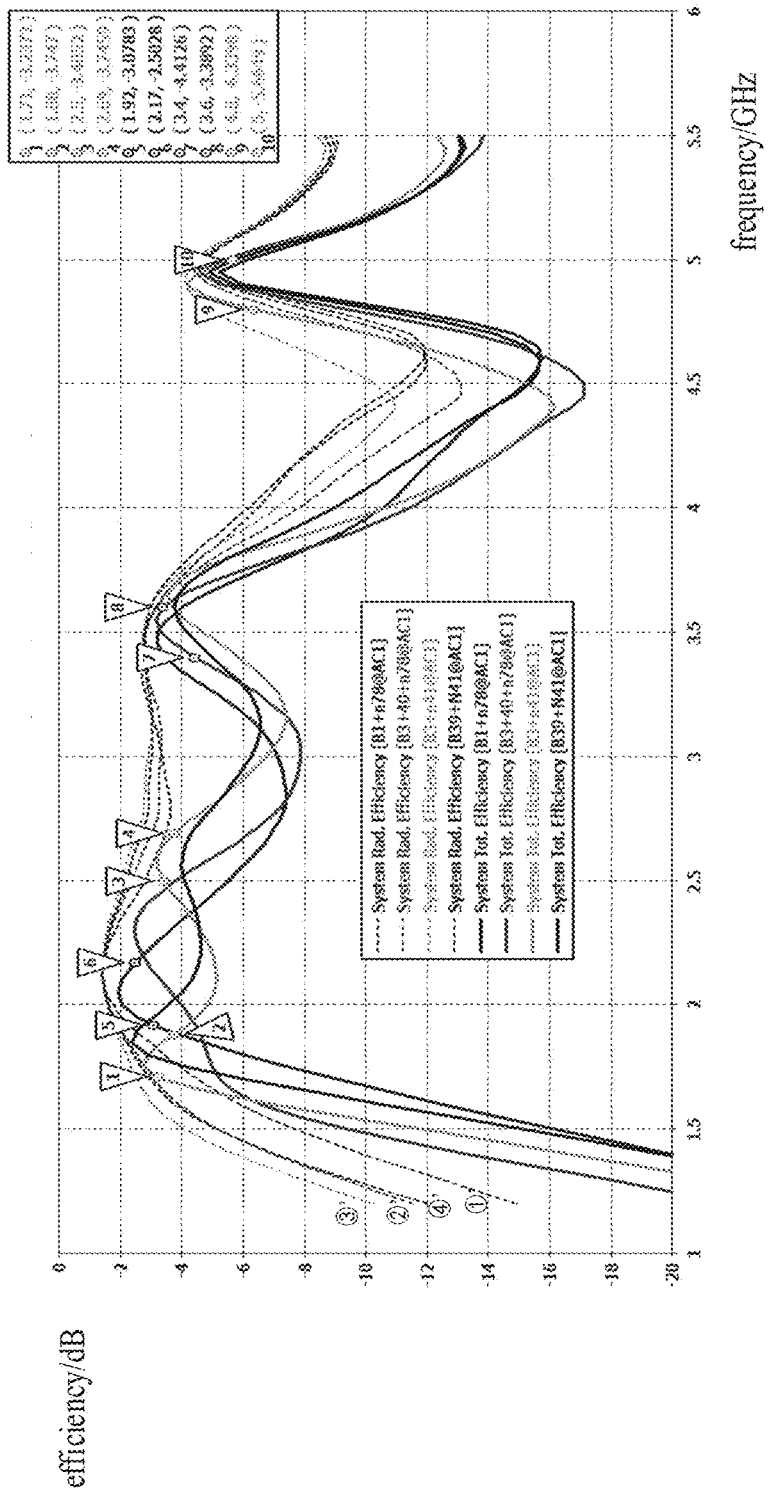
FIG. 12 is a schematic diagram illustrating antenna efficiency corresponding to each curve illustrated in FIG. 11.

Reference is made to FIG. 12, which is a schematic diagram illustrating antenna efficiency corresponding to each curve illustrated in FIG. 11. In the embodiment, the abscissa represents the frequency in GHz and the ordinate represents the efficiency in dB. Curve①' is an efficiency curve corresponding to Curve① in FIG. 11, Curve②' is an efficiency curve corresponding to Curve② in FIG. 11, Curve③' is an efficiency curve corresponding to Curve③ in FIG. 11, and Curve④' is an efficiency curve corresponding to Curve④ in FIG. 11.

In the related art, the efficiency higher than −3.5 dB may be regarded as high efficiency of an antenna 10. As can be seen from the efficiency diagram of the antenna 10, the efficiency of the antenna 10 of the disclosure is higher than −3.5 dB at multiple frequencies. Therefore, the antenna 10 provided in the disclosure has significantly high single-band efficiency and significantly wide ENDC and/or CA state efficiency.

Figure 13:
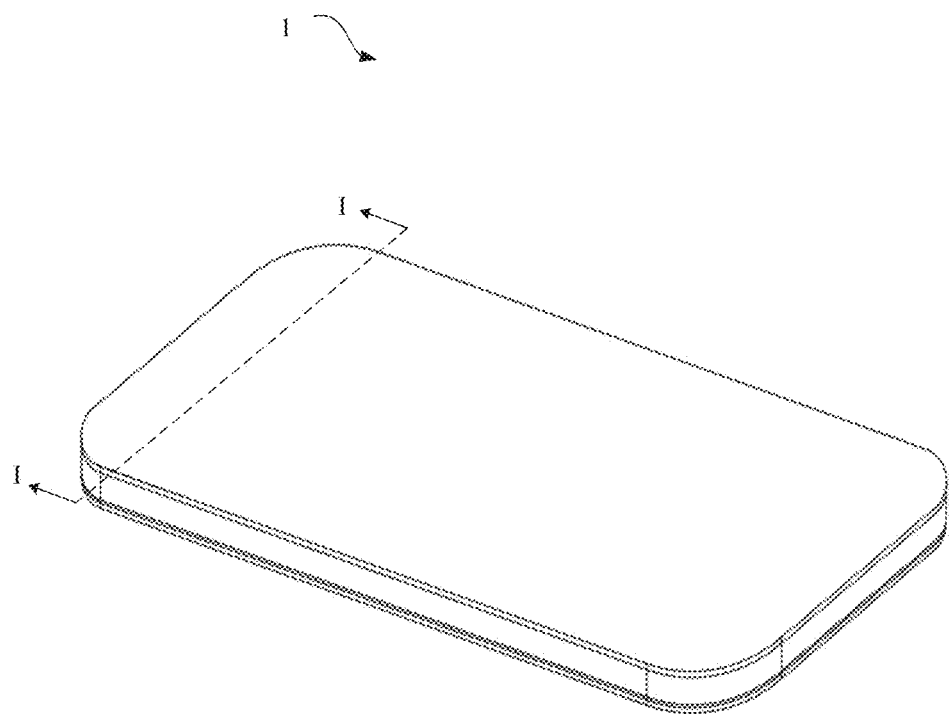
FIG. 13 is a stereoscopic structure diagram of an electronic device provided in an embodiment of the disclosure.
Figure 14:
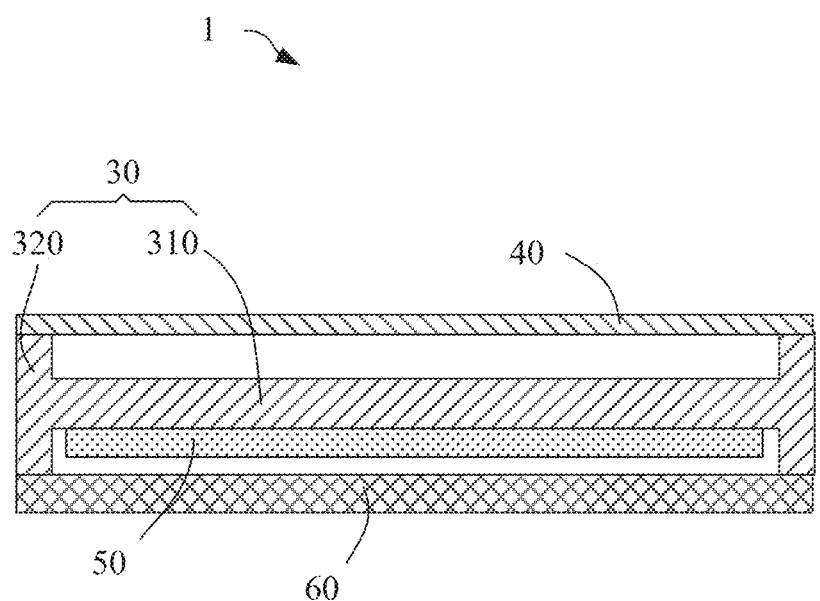
FIG. 14 is a schematic cross-sectional diagram of the electronic device illustrated in FIG. 13, taken along line I-I.

An electronic device 1 is also provided in the disclosure. Reference is made to FIG. 13 and FIG. 14, where FIG. 13 is a stereoscopic structure diagram of an electronic device provided in an embodiment of the disclosure, and FIG. 14 is a schematic cross-sectional diagram of the electronic device illustrated in FIG. 13, taken along line I-I. The electronic device 1 includes any one of antennas 10 provided in the above embodiments. The antennas 10 may be referred to the above description, which will not be repeated here.

In the embodiment, the electronic device 1 includes a middle frame 30, a screen 40, a circuit board 50, and a battery cover 60. The middle frame 30, the screen 40, the circuit board 50, and the battery cover 60 will be described in details in the following.

The middle frame 30 is made of metal, such as aluminum-magnesium alloy and copper plate. At least part of the middle frame 30 (e.g. a main body portion 310 of the middle frame 30) generally constitutes the ground of the electronic device 1. When an electronic component of the electronic device 1 needs to be grounded, the electronic component may be electrically connected to the at least part of the middle frame 30 so as to be grounded. The middle frame 30 includes a main body portion 310 and an edge frame 320 connected to a periphery of the main body portion 310 in a bending manner. At least one of the first radiator 110, the second radiator 150, or the third radiator 170 may be arranged on the edge frame 320, and the main body 310 constitutes the ground of the electronic device 1. When at least one of the first radiator 110, the second radiator 150, and the third radiator 170 is arranged on the edge frame 320, the at least one radiator arranged on the edge frame 320 is electrically connected to the main body 310 so as to be grounded. It is to be understood that when the at least one radiator arranged on the edge frame 320 is electrically connected to the main body portion 310, the at least one radiator may be connected to the main body portion 310 via a conductive elastic piece or a conductive connecting rubber.

It is to be noted that, at least one of the first radiator 110, the second radiator 150, and the third radiator 170 is arranged on the edge frame 320, and the radiator not arranged on the edge frame 320 among the first radiator 110, the second radiator 150, and the third radiator 170 is an FPC antenna radiator, an LDS antenna radiator, or a PDS antenna radiator. For example, if the first radiator 110 and the second radiator 150 are arranged on the edge frame 320, the third radiator 170 is not arranged on the edge frame 320 (e.g., the third radiator 170 is arranged on the circuit board 50), then the third radiator 170 is an FPC antenna radiator, an LDS antenna radiator, or a PDS antenna radiator.

The screen 40 may be a display screen with a display function or a screen 40 integrated with display and touch functions. The screen 40 is configured to display texts, images, videos, and other information. The screen 40 is carried by the middle frame 30 and is at one side of the middle frame 30. The circuit board 50 is also generally carried by the middle frame 30, and the circuit board 50 and the screen 40 are carried on opposite sides of the middle frame 30. At least one of the signal source 140, the matching circuit 120, the first adjustment circuit 130, the fourth adjustment circuit 160, or the isolation circuit 180 in the antenna 10 described above may be arranged on the circuit board 50. The battery cover 60 is arranged on one side of the circuit board 50 facing away from the middle frame 30. The battery cover 60, the middle frame 30, the circuit board 50, and the screen 40 are assembled into a complete electronic device 1 cooperatively. It is to be understood that the description of the structure of the electronic device 1 is only a description of a form of the structure of the electronic device 1, and should not be understood as a limitation to the electronic device 1 or the antenna 10.

Figure 15:
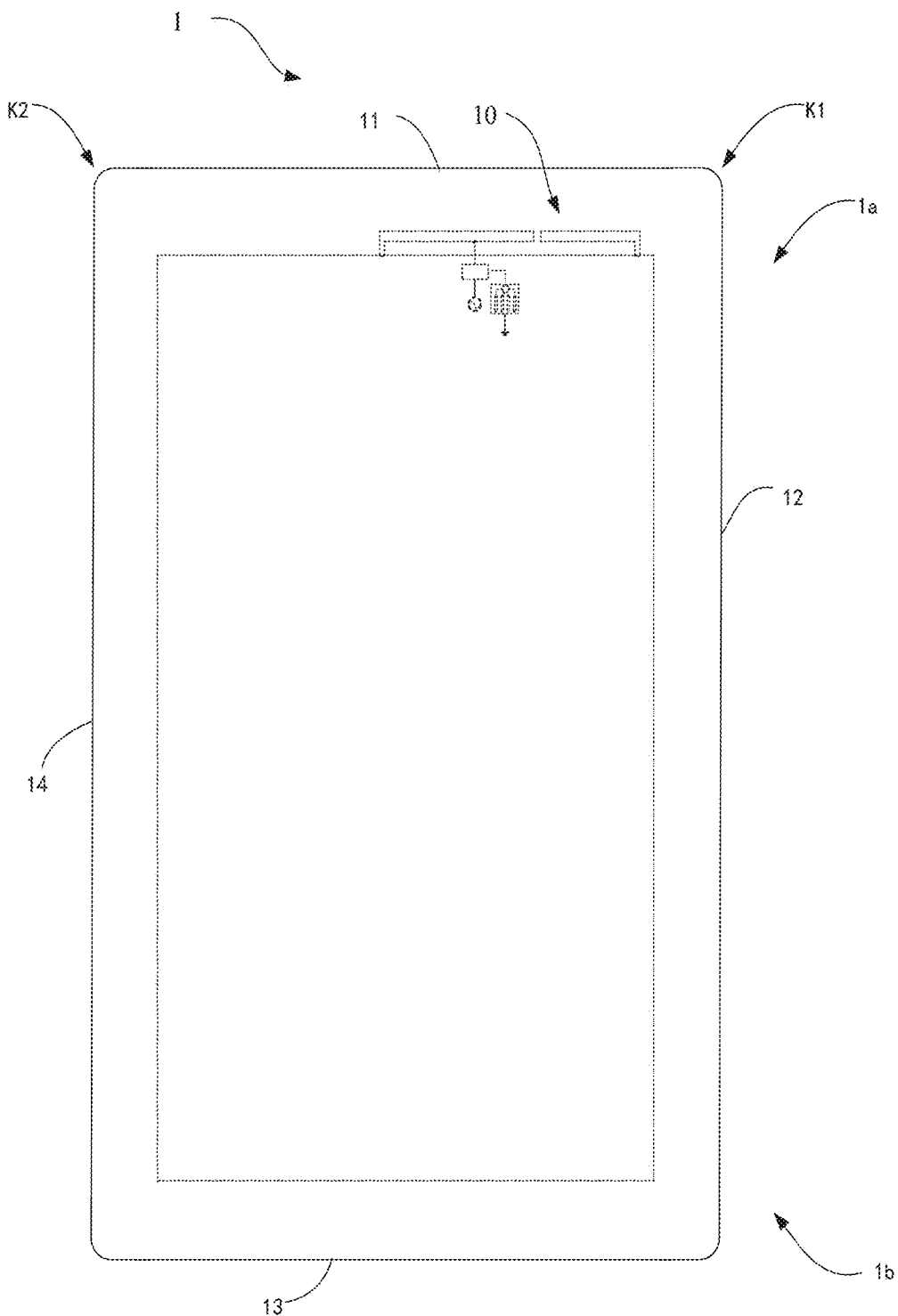
FIG. 15 is a schematic diagram of an electronic device provided in another embodiment of the disclosure.

Reference is made to FIG. 15, which is a schematic diagram of an electronic device provided in another embodiment of the disclosure. The electronic device 1 includes a top 1a and a bottom 1b, and the antenna 10 is disposed on the top 1a.

The top 1a refers to an upper part of the electronic device 1 when the electronic device 1 is placed or used in a stereoscopic manner, while the bottom 1b refers to a lower part of the electronic device 1 opposite to the top 1a. For example, when the electronic device 1 is used in a vertical direction, the top 1a is the upper part of the electronic device 1, which means the top 1a is usually located away from the ground, and the bottom 1b is a part of the electronic device 1 close to the ground, which means the bottom 1b is usually located close to the ground.

The electronic device 1 of the embodiment includes a first side 11, a second side 12, a third side 13, and a fourth side 14 connected in sequence. The first side 11 is opposite and spaced apart from the third side 13, and the second side 12 is opposite and spaced apart from the fourth side 14. The second side 12 is connected to the first side 11 and the third side 13, and the fourth side 14 is connected to the first side 11 and the third side 13. The first side 11 is at the top 1a, and the third side 13 is at the bottom 1b. A connection between the first side 11 and the second side 12, a connection between the second side 12 and the third side 13, a connection between the third side 13 and the fourth side 14, and a connection between the fourth side 14 and the first side 11, each constitute a corner of the electronic device 1. The first side 11 serves as a top side, the second side 12 serves as a right side, the third side 13 serves as a bottom side, and the fourth side 14 serves as a left side. The corner constituted by the first side 11 and the second side 12 serves as a first corner K1, which is an upper right corner; and the corner constituted by the first side 11 and the fourth side 14 serves as a second corner K2, which is an upper left corner.

It is to be noted that, in an embodiment, the first side 11 and the second side 12 are both straight-line segments, the first side 11 is directly connected to the second side 12, which means no curve segment between the first side 11 and the second side 12. In another embodiment, the first side 11 is connected to the second side 12 through a curve segment. In both embodiments, the connections between the first side 11 and the second side 12 each are called as the first corner K1.

Correspondingly, in an embodiment, the first side 11 and the fourth side 14 are both straight-line segments, the first side 11 is directly connected to the fourth side 14, which means no curve segment between the first side 11 and the fourth side 14. In another embodiment, the first side 11 is connected to the fourth side 14 through a curve segment. In both embodiments, the connections between the first side 11 and the fourth side 14 each are called as the second corner K2.

In the embodiment, the top 1a includes the first side 11, the first corner K1, and the second corner K2. When the antenna 10 includes the first radiator 110 and the second radiator 150, the antenna 10 is disposed on the top 1a as follows. The first radiator 110 and the second radiator 150 are arranged at the upper left corner of the electronic device 1; or the first radiator 110 and the second radiator 150 are arranged corresponding to the top side of the electronic device 1; or the first radiator 110 and the second radiator 150 are arranged at the upper right corner of the electronic device 1. When the first radiator 110 and the second radiator 150 are both disposed on the top 1a, the first radiator 110 and the second radiator 150 may be arranged corresponding to the same side or arranged corresponding to different sides.

When the first radiator 110 and the second radiator 150 are arranged at the upper left corner of the electronic device 1, the situations include but are not limited to the following. Part of the first radiator 110 is arranged corresponding to the fourth side 14, the other part of the first radiator 110 is arranged corresponding to the first side 11, and the second radiator 150 is arranged corresponding to the first side 11; or part of the second radiator 150 is arranged at the first side 11, the other part of the second radiator 150 is arranged corresponding to the fourth side 14, and the first radiator 110 is arranged corresponding to the fourth side 14; or the first radiator 110 is arranged corresponding to the first side 11, and the second radiator 150 is arranged corresponding to the fourth side 14; or the first radiator 110 is arranged corresponding to the fourth side 14, and the second radiator 150 is arranged corresponding to the first side 11.

When the first radiator 110 and the second radiator 150 are arranged at the upper right corner of the electronic device 1, the situations include but are not limited to the following. The first radiator 110 is arranged corresponding to the first side 11, the second radiator 150 is arranged corresponding to the second side 12; or the first radiator 110 is arranged corresponding to the first side 11, part of the second radiator 150 is arranged corresponding to the second side 11, and the other part of the second radiator 150 is arranged corresponding to the first side 12; or part of the first radiator 110 is arranged corresponding to the first side 11, the other part of the first radiator 110 is arranged corresponding to the second side 12, and the second radiator 150 is arranged corresponding to the second side 12; or the first radiator 110 is arranged corresponding to the second side 12, and the second radiator 150 is arranged corresponding to the first side 11.

It is to be noted that, in the embodiment, for illustrative purpose, the electronic device 1 includes the first side 11, the second side 12, the third side 13, and the fourth side 14 connected in sequence, which should not be understood as a limitation to the electronic device 1 provided in the embodiment. In other embodiments, the electronic device 1 may include sides in other number, for example, three sides, six sides, etc., as long as the electronic device 1 includes the first side 11 and the second side 12 connected to the first side 11, where the first side 11 is on the top 1a of the electronic device 1, the antenna 10 is disposed adjacent to the first side 11 and adjacent to one end of the first side 11 connected to the second side 12.

In the schematic diagram of the embodiment, for illustrative purpose, the antenna 10 is disposed on the first side 11 and disposed adjacent to the end of the first side 11 connected to the second side 12. Specifically, for illustrative purpose, in the embodiment, the first radiator 110 and the second radiator 150 are both arranged corresponding to the first side 11. In the schematic diagram of the embodiment, for illustrative purpose, the first side 11 and the third side 13 are short sides of the electronic device 1, and the second side 12 and the fourth side 14 are long sides of the electronic device 1. In other embodiments, the length of the first side 11, the second side 12, the third side 13, and the fourth side 14 may be the same, or may be in other situations. The length of the first side 11, the second side 12, the third side 13, and the fourth side 14 should not be understood as a limitation to the electronic device 1 provided in the embodiment. When the antenna 10 is disposed corresponding to the first side 11 and disposed adjacent to the end of the first side 11 connected to the second side 12, the antenna 10 will not be blocked when a user is holding the electronic device 1, thus the communication of the electronic device 1 will not be effected.

When the electronic device 1 is placed or used in a stereoscopic manner, the top 1a of the electronic device 1 is usually arranged away from the ground, and the bottom 1b of the electronic device 1 is usually arranged close to the ground. Therefore, when the first radiator 110 and the second radiator 150 are arranged on the top 1a, the antenna 10 has greater upper hemisphere radiation efficiency, rendering greater communication efficiency of the antenna 10. In other embodiments, however, the first radiator 110 and the second radiator 150 may be arranged on the bottom 1b of the electronic device 1. Although the antenna 10 has lower upper hemisphere radiation efficiency when the first radiator 110 and the second radiator 150 are arranged on the bottom 1b of the electronic device 1, the antenna 10 may still have good communication effect as long as the upper hemisphere radiation efficiency is greater than a preset efficiency.

When the antenna 10 includes the first radiator 110, the second radiator 150, and the third radiator 170 and when the antenna 10 is disposed on the top 1a, the first radiator 110, the second radiator 150, and the third radiator 170 may be arranged corresponding to the same side or different sides.

When the first radiator 110, the second radiator 150, and the third radiator 170 are arranged on the top 1a, the antenna 10 has greater upper hemisphere radiation efficiency, rendering greater communication efficiency of the antenna 10. In other embodiments, however, the first radiator 110, the second radiator 150, and the third radiator 170 may be arranged on the bottom 1b of the electronic device 1. Although the antenna 10 has lower upper hemisphere radiation efficiency when the first radiator 110, the second radiator 150, and the third radiator 170 are arranged on the bottom 1b of the electronic device 1, the antenna 10 may still have good communication effect as long as the radiation efficiency of the upper hemisphere is greater than the preset efficiency.

The above are only some embodiments of the disclosure and are not intended to limit the disclosure. For those skilled in the art, the disclosure may have various modifications and variations. Any modification, equivalent arrangement and improvement made within the spirit and principles of the disclosure shall be included in the scope of protection of the disclosure.

What is claimed is:

1. An antenna comprising:
a first radiator having a first ground end, a first free end, and a feed point between the first ground end and the first free end;
a matching circuit connected to the first radiator via the feed point;
a first adjustment circuit electrically connected to the matching circuit and comprising a switch unit and a plurality of adjustment sub-circuits, the switch unit electrically connecting at least one adjustment sub-circuit to the matching circuit;
a signal source electrically connected to the matching circuit;
a second radiator, wherein a gap is defined between the second radiator and the first radiator, the second radiator is coupled to the first radiator via the gap, the second radiator has a second ground end and a second free end, the second free end is closer to the gap than the second ground end, the antenna has at least two resonant modes, and transmission/reception of electromagnetic wave signals in a middle band (MB) and a high-band (HB) is supported by the at least two resonant modes cooperatively at the same moment, or transmission/reception of electromagnetic wave signals in an MB of long-term evolution (LTE) and an MB of new radio (NR) is supported by the at least two resonant modes cooperatively at the same moment, or transmission/reception of electromagnetic wave signals in an HB of LTE and an HB of NR is supported by the at least two resonant modes cooperatively at the same moment, the at least two resonant modes comprise a first resonant mode and a second resonant mode; and a third radiator, wherein the third radiator is electrically connected to the matching circuit, another resonant mode is supported by the third radiator, wherein transmission/reception of electromagnetic wave signals in a preset frequency band is supported by the another resonant mode, and the preset frequency band is higher than a frequency band of electromagnetic wave signals supported by the first resonant mode and the second resonant mode.

2. The antenna of claim 1, wherein
current distribution in the first resonant mode is from the second ground end to the second free end and from the first free end to the first ground end; and
current distribution in the second resonant mode is from the signal source to the first free end and from the second free end to the second ground end.

3. The antenna of claim 2, wherein the at least two resonant modes further comprise:
a third resonant mode used to support transmission/reception of electromagnetic wave signals in an ultra-high band (UHB).

4. The antenna of claim 3, wherein current in the third resonant mode comprises a first sub-current and a second sub-current, distribution of the first sub-current is from the first ground end to the first free end, and distribution of the second sub-current is from the second ground end to the second free end.

5. The antenna of claim 3, further comprising:
a second adjustment circuit electrically connected to the second radiator configured to adjust a resonant frequency point of the second resonant mode and/or a resonant frequency point of the third resonant mode.

6. The antenna of claim 5, wherein the second adjustment circuit comprises a switch or a variable capacitor electrically connected to the ground.

7. The antenna of claim 1, wherein an adjustment sub-circuit comprises one or more selected from a group consisting of capacitors, inductors, and resistors.

8. The antenna of claim 7, wherein the plurality of adjustment sub-circuits comprises a first adjustment sub-circuit, a second adjustment sub-circuit, a third adjustment sub-circuit, and a fourth adjustment sub-circuit, and the switch unit comprises:
a public end electrically connected to the matching circuit;
a first switch sub-unit electrically connecting the first adjustment sub-circuit to the matching circuit;
a second switch sub-unit electrically connecting the second adjustment sub-circuit to the ground;
a third switch sub-unit electrically connecting the third adjustment sub-circuit to the ground; and
a fourth switch sub-unit electrically connecting the fourth adjustment sub-circuit to the ground.

9. The antenna of claim 8, wherein:
the first adjustment sub-circuit comprises an adjustment capacitor;
the second adjustment sub-circuit comprises a first inductor;
the third adjustment sub-circuit comprises a second inductor; and
the fourth adjustment sub-circuit comprises a third inductor.

10. The antenna of claim 9, wherein the matching circuit comprises:

a first matching sub-circuit, wherein first matching sub-circuit has one end electrically connected to the signal source, and another end electrically connected to the first adjustment sub-circuit, and the first matching sub-circuit and the first adjustment sub-circuit are configured to adjust a capacitance of the antenna; and
a second matching sub-circuit, wherein the second matching sub-circuit has one end electrically connected to the first matching sub-circuit, and another end electrically connected to the feed point, the second matching sub-circuit and at least one of the second adjustment sub-circuit, the third adjustment sub-circuit, or the fourth adjustment sub-circuit are cooperatively configured to adjust an inductance of the antenna.

11. The antenna of claim 10, wherein:
the first matching sub-circuit comprises a first matching capacitor and a second matching capacitor, the first matching capacitor has one end electrically connected to the signal source, and another end electrically connected to the second matching capacitor, and a connection point between the first matching capacitor and the second matching capacitor is electrically connected to the adjustment capacitor; and
the second matching sub-circuit comprises a first matching inductor and a second matching inductor, the first matching inductor has one end electrically connected to one end of the second matching capacitor away from the first matching capacitor, and electrically connected to the public end of the switch unit, and the first matching inductor has another end electrically connected to the feed point; and the second matching inductor has one end electrically connected to the feed point, and another end connected to the ground.

12. The antenna of claim 1, wherein the third radiator has a length ranging from ⅛ to ½ wavelength of the electromagnetic wave signals in the preset frequency band.

13. The antenna of claim 1, further comprising:
an isolation circuit, wherein the isolation circuit is electrically connected to the third radiator and the matching circuit, and the isolation circuit is configured to isolate an interference of the electromagnetic wave signals transmitted/received by the first radiator and the second radiator on the electromagnetic wave signals in the preset frequency band transmitted/received by the third radiator.

14. The antenna of claim 13, wherein the isolation circuit comprises:
a first isolation capacitor, wherein the first isolation capacitor has one end electrically connected to the matching circuit, and another end electrically connected to the third radiator; and
a second isolation capacitor, wherein the second isolation capacitor has one end electrically connected to the other end of the first isolation capacitor, and the other end connected to the ground.

15. The antenna of claim 1, wherein LTE NR double connect (ENDC) and/or carrier aggregation (CA) in a frequency band ranging from 1.0 GHz to 6.0 GHz is implemented by the first radiator, the second radiator, and the third radiator cooperatively.

16. The antenna of claim 1, wherein a width d of the gap satisfies: 0.5 mm≤d≤2.0 mm.

17. An electronic device, comprising:
an antenna, wherein the antenna comprises:
a first radiator having a first ground end, a first free end, and a feed point between the first ground end and the first free end;

a matching circuit connected to the first radiator via the feed point;

a first adjustment circuit electrically connected to the matching circuit and comprising a switch unit and a plurality of adjustment sub-circuits, the switch unit electrically connecting at least one adjustment sub-circuit to the matching circuit;

a signal source electrically connected to the matching circuit; and a second radiator, wherein a gap is defined between the second radiator and the first radiator, the second radiator is coupled to the first radiator via the gap, the second radiator has a second ground end and a second free end, the second free end is closer to the gap than the second ground end, the antenna has at least two resonant modes, and transmission/reception of electromagnetic wave signals in a middle band (MB) and a high-band (HB) is supported by the at least two resonant modes cooperatively at a same moment, or transmission/reception of electromagnetic wave signals in an MB of long-term evolution (LTE) and an MB of new radio (NR) is supported by the at least two resonant modes cooperatively at a same moment, or transmission/reception of electromagnetic wave signals in an HB of LTE and an HB of NR is supported by the at least two resonant modes cooperatively at the same moment, the at least two resonant modes comprise a first resonant mode and a second resonant mode; and a third radiator, wherein the third radiator is electrically connected to the matching circuit, another resonant mode is supported by the third radiator, wherein transmission/reception of electromagnetic wave signals in a preset frequency band is supported by the another resonant mode, and the preset frequency band is higher than a frequency band of electromagnetic wave signals supported by the first resonant mode and the second resonant mode.

18. The electronic device of claim 17, having a top and a bottom, wherein the antenna is disposed on the top.

19. The electronic device of claim 18, comprising a first side and a second side connected to the first side, wherein the first side is at the top of the electronic device, the antenna is disposed adjacent to the first side, and the antenna is disposed adjacent to one end of the first side connected to the second side.

* * * * *